(12) United States Patent
Kawasaki et al.

(10) Patent No.: US 6,933,545 B2
(45) Date of Patent: Aug. 23, 2005

(54) HETERO-BIPOLAR TRANSISTOR HAVING THE BASE INTERCONNECTION PROVIDED ON THE NORMAL MESA SURFACE OF THE COLLECTOR MESA

(75) Inventors: Takeshi Kawasaki, Yokohama (JP); Hiroshi Yano, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/859,615

(22) Filed: Jun. 3, 2004

(65) Prior Publication Data

US 2005/0017267 A1 Jan. 27, 2005

(30) Foreign Application Priority Data

Jun. 4, 2003 (JP) ........................................ 2003-159910

(51) Int. Cl.[7] .............................................. H01L 29/737
(52) U.S. Cl. ...................... 257/197; 257/201; 257/586; 257/587; 257/615; 257/745; 257/773
(58) Field of Search ................................ 257/197, 198, 257/201, 586, 587, 744, 745, 773

(56) References Cited

U.S. PATENT DOCUMENTS

| | | | | | |
|---|---|---|---|---|---|
| 5,614,423 | A | * | 3/1997 | Matsuoka et al. | .......... 438/312 |
| 6,495,869 | B2 | | 12/2002 | Blayac et al. | ................ 257/197 |
| 6,531,722 | B2 | * | 3/2003 | Yaegashi et al. | ............. 257/197 |
| 6,664,610 | B2 | * | 12/2003 | Kawasaki et al. | ........... 257/565 |
| 6,784,064 | B2 | * | 8/2004 | Yaegashi et al. | ............. 438/317 |

FOREIGN PATENT DOCUMENTS

JP            11-260827            9/1999

* cited by examiner

Primary Examiner—Gene M. Munson
(74) Attorney, Agent, or Firm—Smith, Gambrell & Russell, LLP

(57) ABSTRACT

The present invention provides a hetero-bipolar transistor having a new configuration of the interconnection. The bipolar transistor of the present invention includes the collector mesa, having the base and collector layers therein, includes a first side having a normal mesa surface and extending along the [01-1] orientation, and a second side having a reverse mesa surface and extending along the [011] orientation. The present HBT has a base interconnection, a portion of which diagonally intersects the first side of the collector mesa, accordingly, the breaking of the interconnection may not occur and the high frequency performance of the HBT may be enhanced because the width of the collector mesa is not necessary to widen to disposed the base interconnection on the first side.

10 Claims, 7 Drawing Sheets

HETERO-BIPOLAR TRANSISTOR HAVING THE BASE INTERCONNECTION PROVIDED ON THE NORMAL MESA SURFACE OF THE COLLECTOR MESA

BACKGROUND OF THE INVENTION

1. Field of the Invention

The present invention relates to a hetero-bipolar transistor, in particular, relates to an interconnection connected to electrodes thereof

2. Related Prior Art

A hetero-bipolar transistor (hereinafter denoted as HBT), in particular the HBT made of primarily group III and group V compound semiconductor material, provides a mesa structure for its major active region. A thickness of the mesa structure reaches sub-micron meters. Further, the semiconductor material used in the HBT has a crystal structure of the zinc blend type. When such thick semiconductor material having the zinc blend type structure is wet-etched, an anisotropic profile may occur in the etched surface. That is, a normal mesa surface, that makes an obtuse angle against the surface exposed by the etching, appears along [01–1] orientation, while a reverse mesa surface, which makes an acute angle against the surface exposed by the etching, appears along [011] orientation. Even in the surface along the [01–1] orientation, which appears the normal mesa surface, influenced by the reverse mesa surface along the [011] orientation, the width thereof is narrower in the root and the wider the closer to the top thereof.

A shape of the insulating film covering the mesa reflects the normal mesa surface and the reverse mesa surface, namely, a steep edge appears in direction along [011] orientation, and a gradual slope appears along [01–1] orientation. Therefore, an interconnection connected to the electrode formed within in the mesa is generally pulled out such that the interconnection intersects the surface along [01–1] orientation, in other words, runs along [011] orientation.

However, when the mesa region is so thick that the reverse mesa surface affects the shape of the normal mesa surface as previously mentioned, the width of the mesa region must be wide enough for the interconnection to the electrode within the mesa region to reliably put on the normal mesa surface. The wider mesa region results on the increase of the parasitic capacitance of the HBT, and degrades the high frequency performance thereof that is most expected in the HBT.

Therefore, one object of the present invention is to provide the HBT having a reliable interconnection without degrading the high frequency performance thereof

SUMMARY OF THE INVENTION

According to one aspect of the present invention, a hetero-bipolar transistor is provided. The hetero-bipolar transistor, according to the present invention, includes a collector layer, a base layer, and a base interconnection. The collector layer forms a first mesa having first and second sides, each extending along direction intersecting with respect to each other. The first side of the collector layer has a normal mesa surface and the second side thereof has a reverse mesa surface. The base interconnection of the present invention diagonally intersects the normal mesa surface, and is fully put thereon.

Since the base interconnection diagonally intersects the normal mesa surface of the first mesa, the width of the first mesa is not necessary to be widened to secure the space in which the interconnection is fully put on, whereby a parasitic capacitance attributed to the area of the first mesa, the collector mesa, does not increase to degrade the high frequency performance of the HBT. Further, the base interconnection intersects the normal mesa surface, which makes an obtuse angle against the base surface therebeneath, a breaking of wiring at the step formed at the edge of the mesa may not be induced.

The first side of the collector layer extends along [01–1] orientation, and the second side thereof extends along [011] orientation. The base interconnection may include a first to fifth portions. The first and fourth portions may be disposed within the collector mesa, the third portion may be disposed outside of the collector mesa, and the second and fifth portions, each disposed between the first and third portions, and between the fourth and third portions, respectively. In the base interconnection of the present invention, the second and fifth portions diagonally intersect the normal mesa surface and are fully put thereon. The second portion extends along first direction, while the fifth portion extends along the second direction, and the first and second directions both intersect not only [01–1] and [011] orientations but also intersect with respect to each other.

Figure 6A:
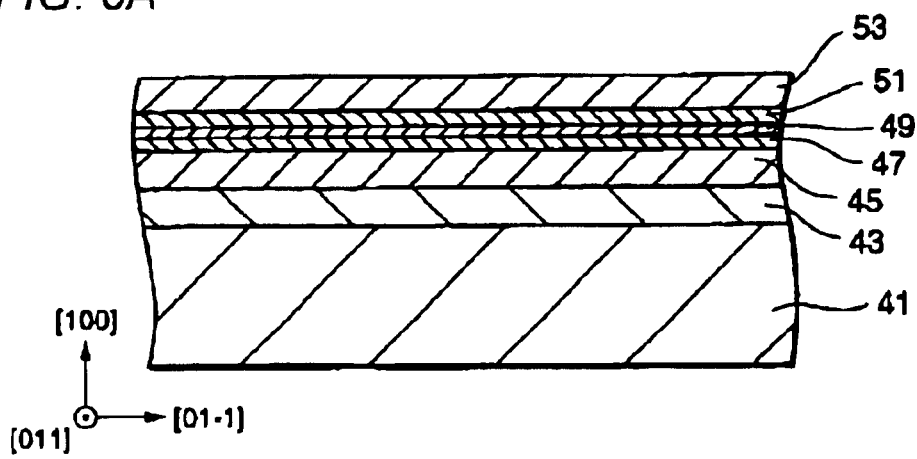
Figure 6B:
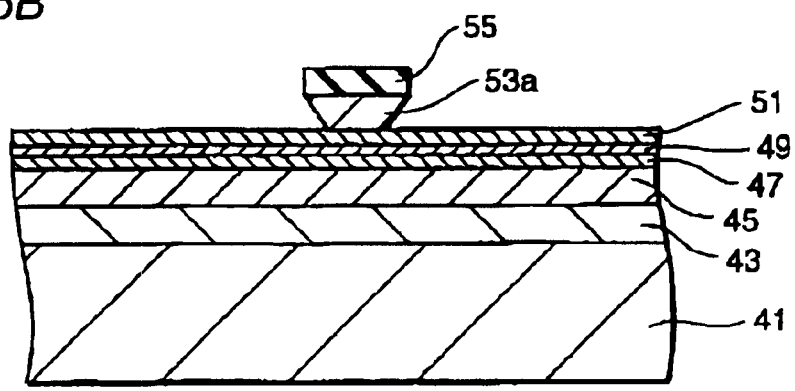
Figure 6C:
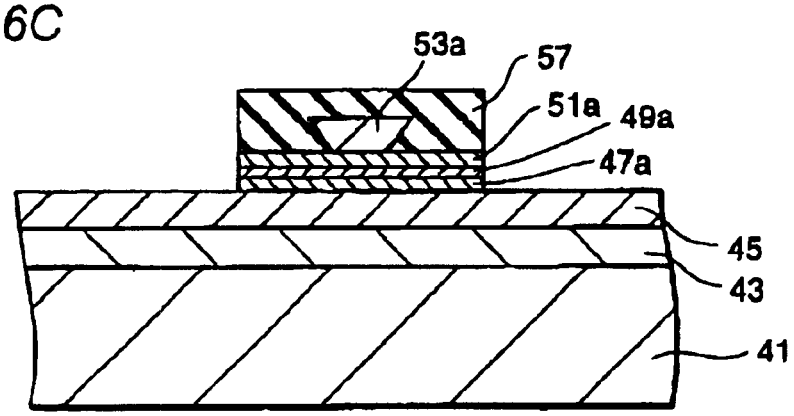
Figure 7A:
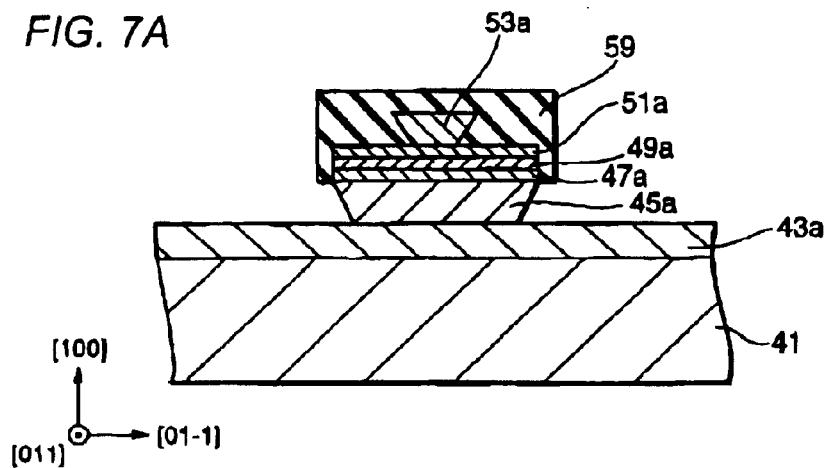
Figure 7B:
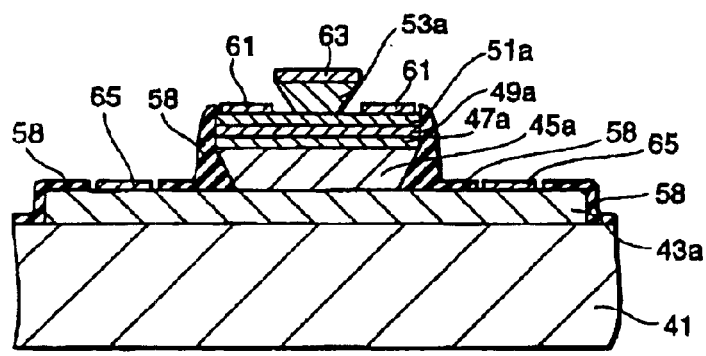
Figure 7C:
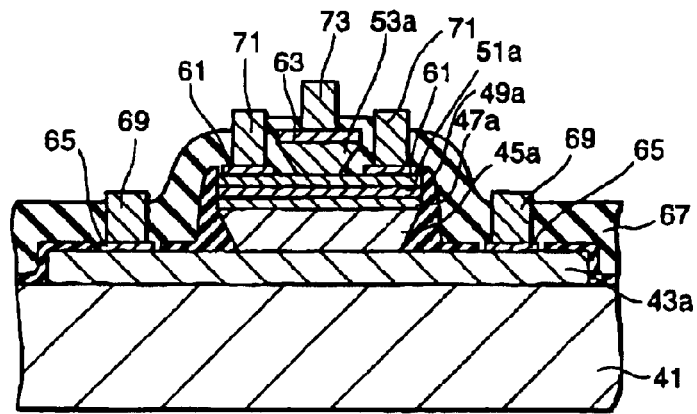

from FIG. 6A to FIG. 6C are cross sectional views showing manufacturing steps of the present HBT; and from FIG. 7A to FIG. 7B are cross sectional view showing manufacturing steps of the present HBT subsequently to FIG. 6C.

DETAILED DESCRIPTION OF PREFERRED EMBODIMENTS

Preferred embodiments of the hetero-bipolar transistor according to the present invention will be described as referring to accompanying drawings. In the drawings and the specification, same elements will be referred by same symbols and numerals without overlapping explanations.

Figure 1:
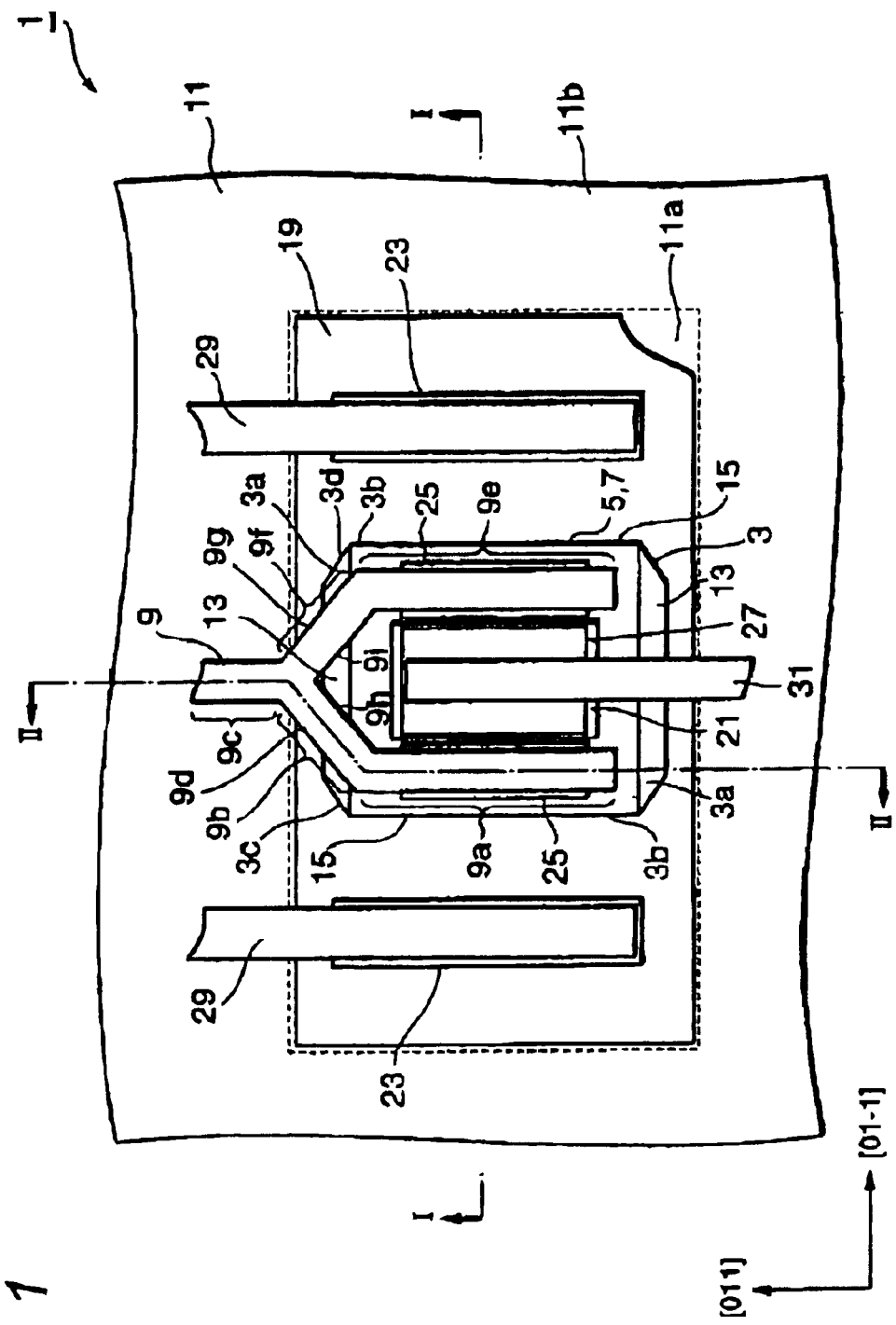
FIG. 1 is a plan view showing an embodiment of the present invention.
Figure 2A:
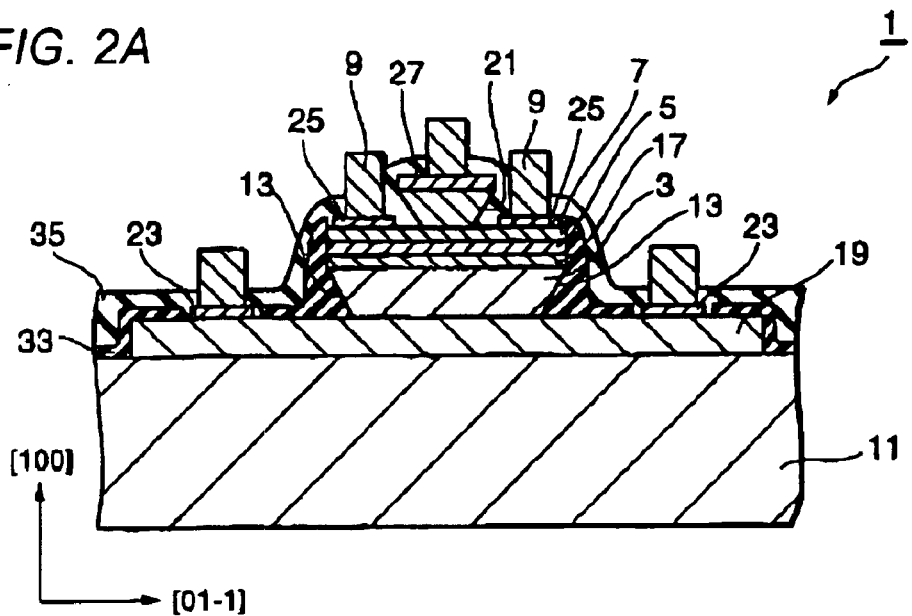
FIG. 2A is a cross sectional view taken along the line I—I in FIG. 1.
Figure 2B:
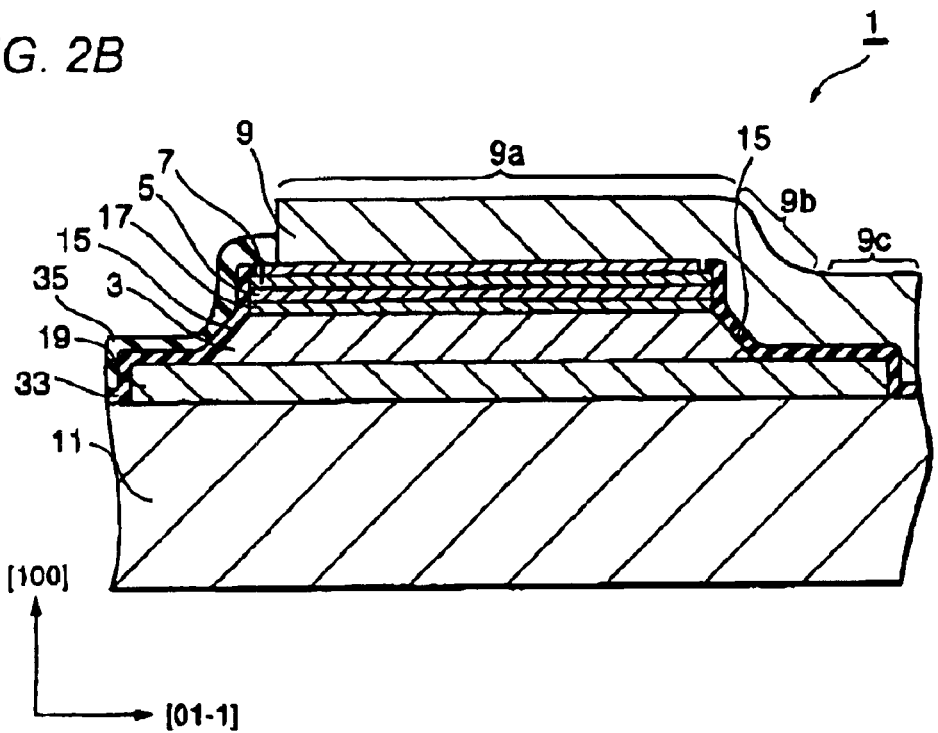
FIG. 2B is a cross sectional view taken along the ling II—II in FIG. 1.

FIG. 1 is a plan view showing a hetero-bipolar transistor (hereinafter denoted as HBT) according to the present invention, FIG. 2A is a cross sectional view taken along the line I—I in FIG. 1 and FIG. 2B is a cross sectional view taken along the line II—II.

The HBT 1 includes a collector mesa 3, a base layer 5, an emitter layer 7, and a base interconnection 9. The collector mesa 3 is provided on the substrate 11, and includes a pair of sides 3a along a first direction, [01–1] orientation, and another pair of sides 3b along a second direction, [011] orientation. The base layer 5 is formed on the collector mesa 3, and the emitter layer 7 is formed on the base layer. The base interconnection 9 is electrically connected to the base layer 5, and has a side 9d extending along a third direction different to the first and second directions on the side 3a of the collector mesa 3. The base interconnection 9 passes between edges 3c and 3d of the side 3a of the collector mesa 3.

The base interconnection 9 includes first to third portions, 9a, 9b and 9c. The first portion 9a is disposed on the base layer 5, the second portion 9b, connected to the first portion 9a, intersects the side 3a of the collector mesa 3. The third portion 9c, connected to the second portion 9b, is disposed on the substrate 11. The base interconnection further includes fourth and fifth portions 9e and 9f. The fourth portion 9e, pairing with the first portion 9a and connected to the base layer, is electrically connected to the base layer 5. The fifth portion 9f, paring with the second portion 9b and disposed between the third 9c and fourth portions 9e, intersects the side 3a of the collector mesa 3. The fifth portion 9f extends along the fourth direction intersecting both the first and second directions, and the third direction. The side 3a of the collector mesa 3 is a normal mesa surface 13 that makes an obtuse angle to the surface of the layer formed beneath, and the side 3b of the collector mesa 3 is a reverse mesa surface that makes an acute angle to the surface of the layer formed beneath.

Since the base interconnection 9 diagonally passes on the side of the collector mesa 9 in the present HBT 1, it is not necessary to widen the length between the sides 3c and 3d. Further, since the side 3a of the collector mesa has the normal mesa surface, the breaking of the interconnection is not induced. The width between the edges 3c and 3d of the collector mesa 3 is gradually decreased from the top of the collector mesa to the bottom thereof. The edge 9d of the base interconnection 9 is apart from the edge 3c of the collector mesa 3.

The HBT 1 may further include a graded layer 17 between the collector layer 3 and the base layer 5. The band gap energy of the graded layer 17 gradually changes from the collector layer 3 to the base layer 5 to reduce the band edge scattering of carriers running from the base layer 5 to the collector layer, which enhances not only the high frequency performance of the HBT 1 but also the break down voltage thereof.

The HBT 1 may further provide the sub-collector layer 19. The sub-collector layer 19 is formed on the first region 11a of the substrate 11, while the second region 11b of the substrate 11 provides the third portion 9c of the base interconnection 9 thereon.

The HBT 1 may include the emitter contact layer 21 on the emitter layer 7. The emitter contact layer extends along the first direction, the [011] orientation. The first portion 9a and the fourth portion 9e of the base interconnection 9 sandwich the emitter contact layer 21 on the base layer 5.

The collector electrode 23 is disposed on the sub-collector layer 19, the base electrode 25 is disposed on the base layer 9, and the emitter electrode 27 is disposed on the emitter layer 21. The semiconductor layers of the HBT 1 are fully covered by the insulating films 33 and 35 having openings at positions corresponding to the collector, base, and emitter electrodes, 23, 25 and 27, respectively. The collector interconnection 29, connected to the collector electrode 23, extends along the first direction, and the emitter interconnection 31, connected to the emitter electrode 27, also extends along the first direction. The shape of the insulating films 33 and 35 reflects that of the collector mesa 3.

The semiconductor layers of the HBT 1 are illustrated in exemplary as follows: the collector mesa 3 is stacked of the i-InP base layer 5, the p$^+$-InGaAs emitter layer 7, and the InGaAlAs graded layer, the substrate is the semi-insulating InP doped with iron, and the sub-collector layer 19 and the emitter contact layer 21 are n$^+$-InGaAs.

Figure 3A:
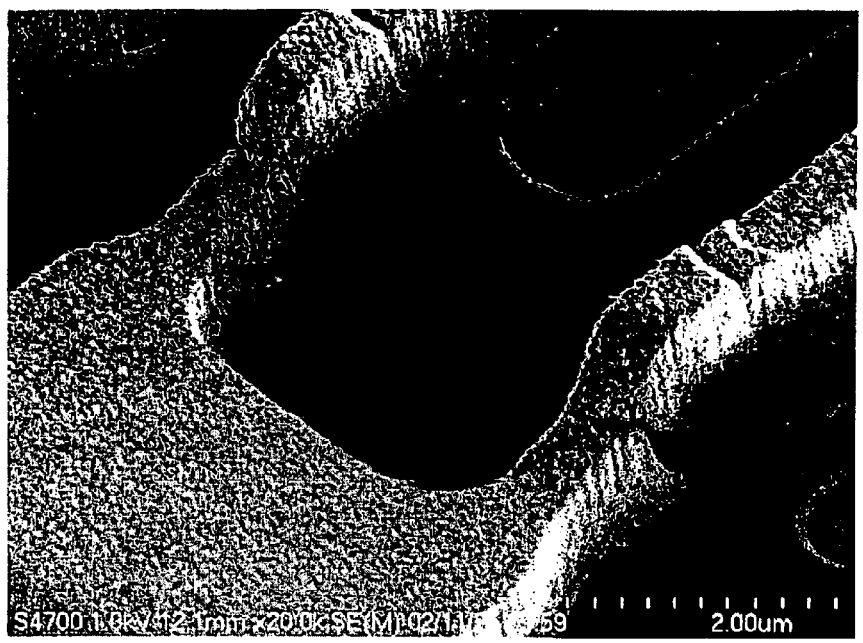
FIG. 3A and FIG. 3B are SEM photograph comparably appearing the base interconnection of the present and the conventional HBT.
Figure 3B:
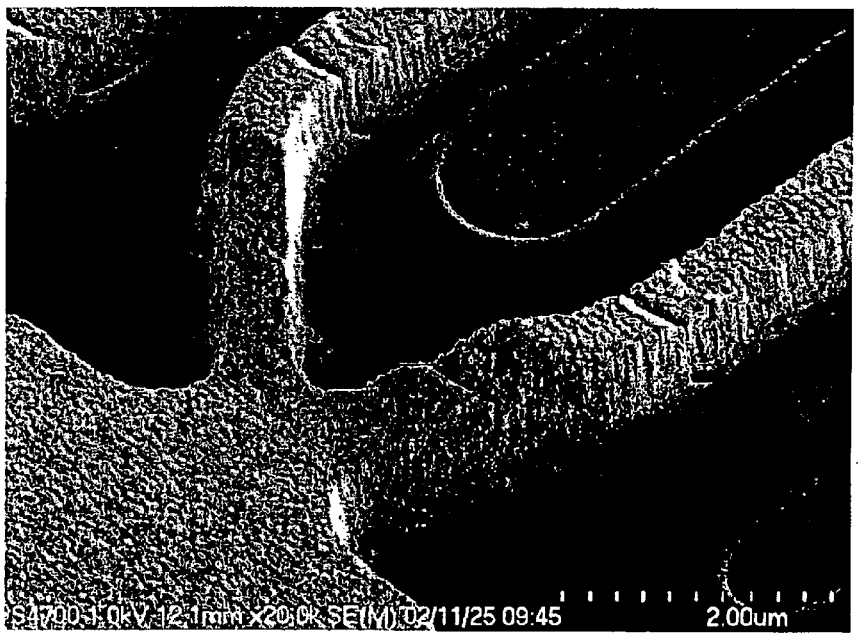

FIG. 3A and FIG. 3B are SEM photograph showing the base interconnection. As shown in FIG. 3A, the base interconnection does not pass on the side with the reverse mesa surface. Accordingly, various faults, such as breaking of the interconnection and cracking of film formed thereon due to a steep edge of the reverse mesa surface, are not induced. On the other hand, when the base interconnection passes the side with the reverse mesa surface, the breaking of the interconnection may be induced partially or entirely crossing the interconnection.

Figure 4A:
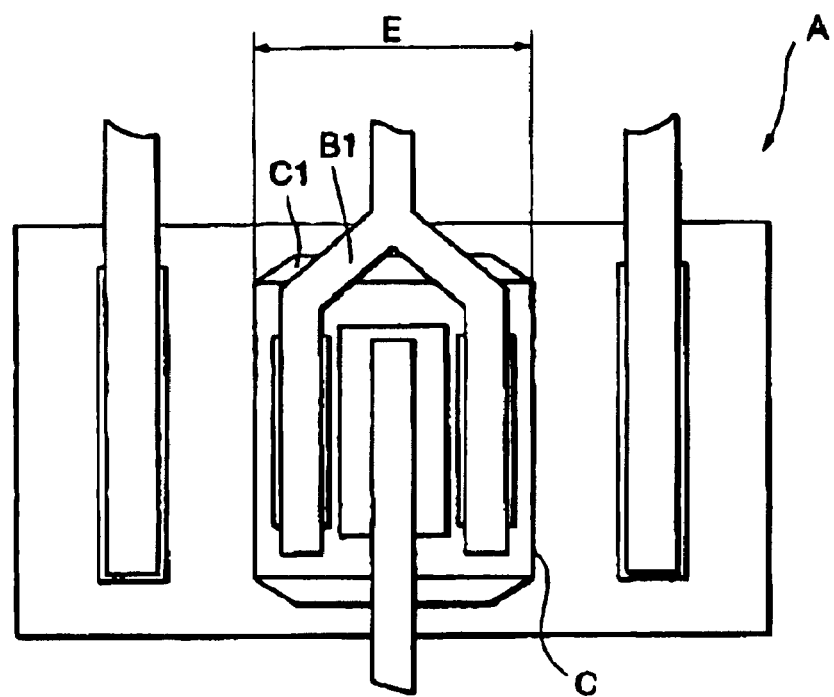
FIG. 4A and FIG. 4B comparably show plan views of the arrangement of the base interconnection according to the present invention and the conventional HBT.
Figure 4B:
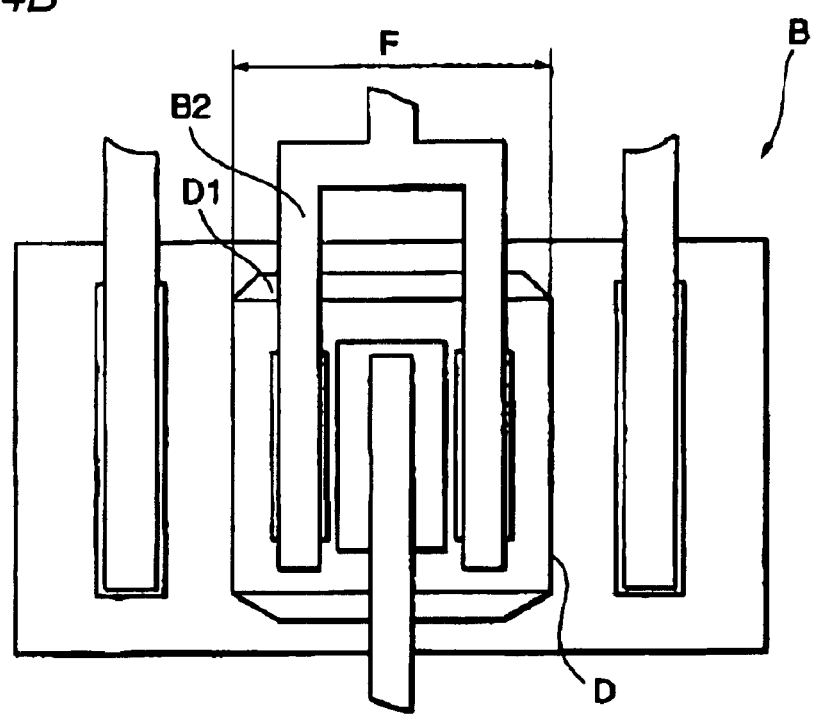

FIG. 4A and FIG. 4B are plan views showing the arrangement of the base interconnection. In the HBT 4a in FIG. 4A, the base interconnection B1 diagonally crosses the side C1 of the collector mesa C, while the base interconnection B2 of the HBT 4B in FIG. 4B crosses the side d1 of the collector mesa in a right angle. Although both interconnections B1 and B2 do not pass on the side with the reverse mesa surface, the width of the collector mesa E of the present HBT is narrower than that F of the conventional HBT, thereby reducing the parasitic capacitance of the collector. Thus, the present HBT may enhance not only the reliability by decreasing the breaking of the wiring or the cracking of the film, but also the high frequency performance by reducing the parasitic capacitance.

Figure 5:
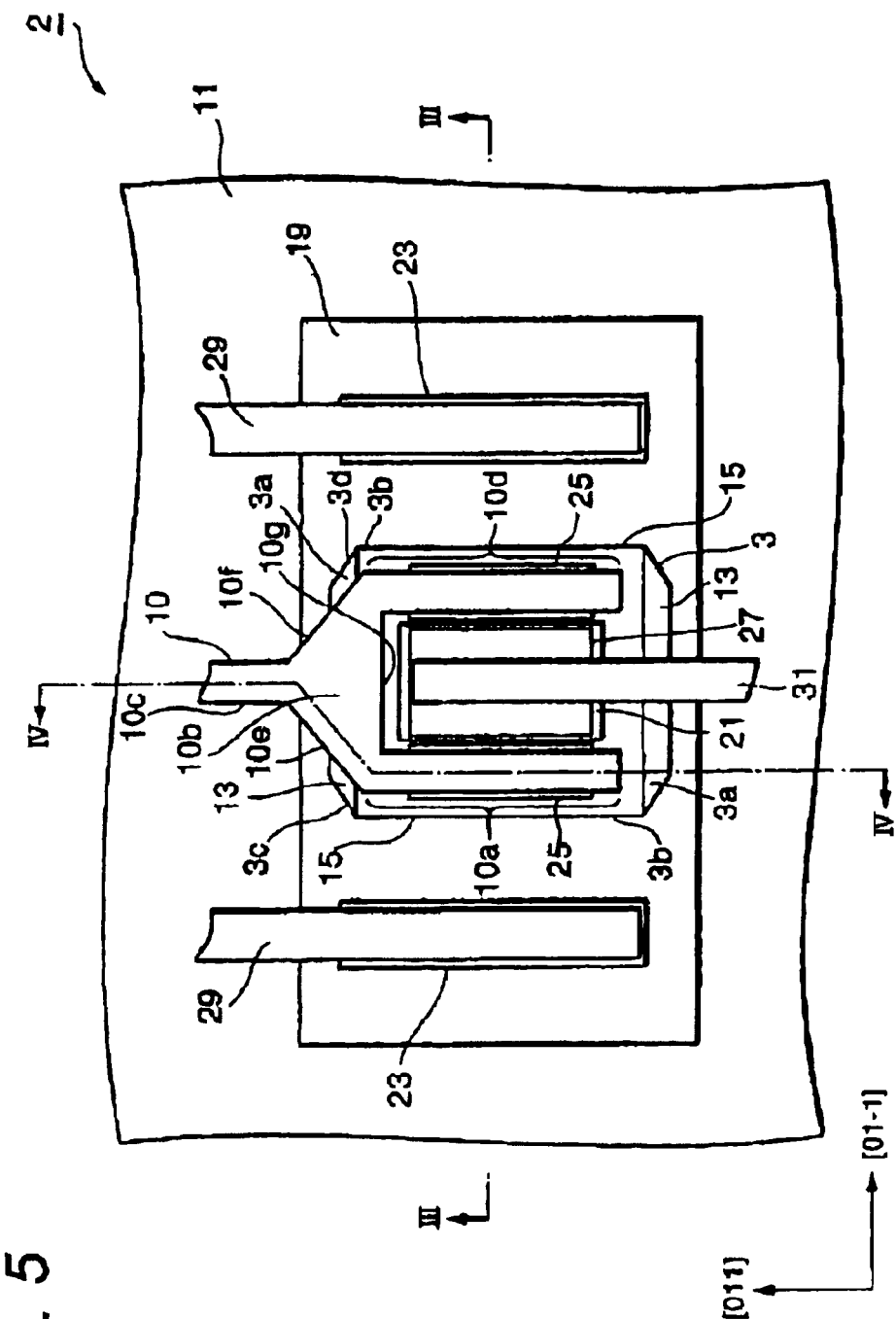
FIG. 5 is a plan view showing another configuration of the base interconnection.

FIG. 5 is a plan view showing an HBT 2 with a modified base interconnection. The cross section taken along the ling III—III in FIG. 5 is same with that shown in FIG. 2A, and another cross section along the line IV—IV is similar to those shown in FIG. 2B.

The HBT 2 includes the collector mesa 3, the base layer 5, the emitter layer 7, the base interconnection 10, and the emitter cap layer 21. The collector mesa 3 is formed directly on the substrate 11. The collector mesa includes a pair of sides 3a extending along the first direction, [01–1] orientation, and another pair of sides 3b along the second direction, [011] orientation. Further, the HBT provides insulating films, which are referred as 33 and 35, respectively, in FIG. 2A and FIG. 2B, to cover semiconductor layers and interconnections. The appearance of these films 33 and 35 reflects the shape of the collector mesa 3, namely, steps are formed at the side 3a and 3b of the collector mesa 3. The base interconnection 10, the collector interconnection 29 and the emitter interconnection 31 are formed on the insulating film 33.

The base interconnection 10 includes first to fourth portions from 10a to 10d. The first, third and fourth portions 10a, 10c and 10d extend along the first direction, [011] orientation. The first and fourth portions are disposed on the base layer 5. The second portion 10b, connected to the first and for the portions 10a and 10d, crosses the side 3a of the collector mesa 3. The third portion 10c, connected to the second portion 10b, is formed on the substrate 11. The first and third portions dispose the emitter cap layer 21 therebetween.

The second portion 10b of the base interconnection includes edges 10e and 10f, the former edge 10e extending along the third direction, which intersects both first and second directions, while the latter edge 10f extending along the fourth direction which also intersects the first and second direction and different to the third direction. The width between edges 10e and 10f is narrower than the width between tow sides 3c and 3d of the collector mesa 3. Further, the base interconnection 10 includes an edge 10g in the second portion 10b extending along the second direction, [01–1] orientation. The edge 10g is provided on the emitter mesa 3.

In the HBT 2, similar to the previous HBT 1, the second portion 10b of the base interconnection 10 does not cross over the side 3b of the collector mesa appearing the reverse mesa surface, accordingly, the breaking of the base interconnection or the cracking in the insulating film can be prevented.

At the side 3a of the collector mesa 3, the width between the sides 3c and 3d is gradually decreased from the top of the mesa to the bottom thereof. The edges 10e and 10f of the base interconnection 10 are respectively apart from the sides 3c and 3d of the collector mesa 3, which enables to shrink the size of the collector mesa and, accordingly, to reduce the parasitic capacitance of the HBT 2. Thus, the HBT according to the present invention, the reliability of the base interconnection and the high frequency performance may be increased.

Next, the manufacturing method of the present HBT will be described as referring to figures from FIG. 6A to FIG. 7C. These figures illustrate cross sections at respective steps.

In FIG. 6A, semiconductor films from 43 to 53 are grown on a semi-insulating substrate 41. The substrate in this embodiment may be indium phosphide (InP) doped with iron (Fe). The semiconductor film 43 on the substrate 41, provided for the sub-collector layer, is n$^+$-InGaAs with 300 nm in thickness. The semiconductor film 45, provided for the collector layer, is i-InP with 350 nm in thickness. The film 47, disposed for the graded layer, is InGaAlAs with 80 nm in thickness. The film 49, provided for the base layer, is p$^+$-InGaAs with 50 nm in thickness. The film 51, provided for the emitter layer, is n$^+$-InP with 10 nm in thickness. The film 53, provided for the emitter contact layer, is n$^+$-InGaAs with 250 nm in thickness. These materials and their thickness are exemplary. Other combination of semiconductor layers and their thickness may be applicable for the present HBT.

In FIG. 6B, the processed emitter contact layer 53a with a mask 55 is illustrated. The mask 55 is made of, for example, silicon nitride (SiN). The emitter contact layer 53a is etched with the SiN 53 as an etching mask. A phosphoric acid is used as an etchant for InGaAs. The phosphoric acid shows a selective etching characteristic for InP, namely, the etching capability of the phosphoric acid for InGaAs is far greater than that for InP. Therefore, the etching for the InGaAs film 53 may substantially stop at the InP film 51 provided beneath the InGaAs film 53. Thus, the emitter contact layer 53a having a reverse mesa surface on both sides thereof is formed. After the etching, the SiN layer is removed.

In FIG. 6C, another mask 57 is formed on the semiconductor films. The mask 57 is also made of silicon nitride (SiN). Using the SiN mask 57, the semiconductor films 51, 49, and 47 are etched in this order. Two step etching is performed. That is, using an etchant containing hydrochloric acid etches the semiconductor layer 51 made of InP in the first step. Next, another etchant containing phosphoric acid etches the semiconductor films 49 and 47, made of InGaAs and InGaAlAs, respectively. Thus, the emitter layer 51a, the base layer 49a, and the graded layer 47a are formed.

In FIG. 7A, another mask 59 is formed on the semiconductor layers such that the mask 59 covers the emitter contact layer 53a, the emitter layer 51a, the base layer 49a, and the graded layer 47a. This mask 59 is also made of SiN. The semiconductor film 45, made of InP, is etched by the etchant containing hydrochloric acid. The collector mesa 45a thus formed includes sides with the reverse mesa surface extending along [011] orientation, while sides with the normal mesa surface extending along [01–1] orientation. After forming the collector mesa 45a, the sub-collector mesa 43a shown in FIG. 7B is formed by using another mask, which is not shown in FIG. 7A.

In FIG. 7B, the emitter interconnection, the base interconnection, and collector electrode are formed. A SiN film 58 fully covers the InP substrate 41 and thus formed semiconductor layers from 43a to 53a. The appearance of the SiN film 58 reflecting the shape of these semiconductor layers has the step at the side of the collector mesa 43a. Openings in the SiN film 58 are formed for the emitter layer, the base layer, and a position where the collector electrode is to be formed. The base and emitter electrodes 61 and 63 are formed by the so-called lift-off process. The collector electrode 65 is formed on the sub-collector mesa 43a by the lift-off process. These electrodes 61, 63, and 65 are made of titanium, platinum and gold stacked in this order.

Finally, as shown in FIG. 7, another SiN film 67 is formed to cover the electrodes 61, 63 and 65. The shape of the SiN film, reflecting the appearance of the semiconductor layer 53a, 51a, 49a, and 43a covered thereby, includes steps at sides of the collector mesa 45a. The base interconnection and the collector interconnection are formed at the same process step by the lift-off process. That is, a multi-layered mask made of photo-resist/silicon oxide/photo-resist is formed on the SiN film 67. This multi-layered mask has openings corresponding to the base interconnection and the collector interconnection. The openings, as shown in previous plan view of the HBT in FIG. 1 and FIG. 5, does not intersect the side with the reverse mesa surface of the collector mesa, have edges inclined to the [011] orientation, and pass between two sides of the collector mesa. After etching the SiN using this multi-layered mask, a wiring metal made of stacked titanium, platinum and gold are formed on the SiN film. Removing the multi-layered mask, the excess metal deposited on the mask may be removed with the mask, thus forms the base interconnection 71 and the collector interconnection 69. Similar process using the multi-layered mask may be applied to the formation of the emitter interconnection 73. The HBT 1 has been completed.

While the invention has been described particularly with respect to preferred embodiments thereof, it will be apparent that modifications to the disclosed embodiments can be effected without departing from the spirit and scope of the invention.

What is claimed is:

1. A hetero-bipolar transistor, comprising:
   a collector layer forming a first mesa including a first side extending along a first direction and a second side extending along a second direction intersecting to said first direction;
   a base layer disposed on said collector layer; and
   a base interconnection connected to said base layer, said base interconnection diagonally intersecting said first side of said collector layer, wherein said first side of said collector layer has a normal mesa surface and said second side of said collector layer has a reverse mesa surface.

2. The hetero-bipolar transistor according to claim 1, further includes an emitter contact layer provided on said base layer, and said base interconnection includes a first portion, a second portion, a third portion, a fourth portion, and a fifth portion, said first and forth portions being provided on said base layer to place said emitter contact layer therebetween, said third portion being provided outside said base layer, said second and fifth portions being provided between said first and third portions and between said fourth and third portions, respectively, and said second and fifth portions diagonally intersecting said first side of said collector layer.

3. The hetero-bipolar transistor according to claim 2, wherein said second and fifth portions of said base interconnection extending along directions intersecting with each other on said first side of said collector layer.

4. The hetero-bipolar transistor according to claim 1, further includes an emitter layer provided on said base layer and a substrate, said collector layer, said base layer and said emitter layer being provided on said substrate.

5. An hetero-bipolar transistor, comprising;

a semiconductor substrate;

a collector layer provided on said semiconductor substrate;

a base layer having a first band gap energy layer and being provided on said collector layer;

an emitter layer having a second band gap energy greater than said first band gap energy of said base layer and being provided on said base layer;

an emitter contact layer provided on said emitter layer; and a base interconnection connected to said base layer, wherein said collector layer, said base layer, and said emitter layer forms a first mesa having a first side and a second side and said emitter contact layer forms a second mesa, said first side including a normal mesa surface and said second side including a reverse mesa surface, and said base interconnection diagonally intersects said first side of said first mesa.

6. The hetero-bipolar transistor according to claim 5, wherein said first normal mesa surface of said first side of said first mesa has a shape such that a width thereof is narrowest at a side of said substrate and is gradually widened to a side of said emitter layer, and wherein said base interconnection is filly put on said normal mesa surface of said first mesa.

7. The hetero-bipolar transistor according to clan 5, wherein said base interconnection includes a first portion, a second portion, a third portion, a fourth portion, and a fifth portion, said first and fourth portions being provided within said first mesa and putting said second mesa therebetween, said third portion being provided outside said first mesa, said second and fifth portions being positioned between said first and third portions, and between said fourth and third portions, respectively, and said second and fifth portions diagonally intersecting and being fully put on normal mesa surface of said first mesa.

8. The hetero-bipolar transistor according to claim 7, wherein said normal mesa surface of said first mesa extends along [01–1] orientation, said reverse mesa surface of said mesa extends along [011] orientation, and said second and fifth portions extends along first and second directions, respectively, said first direction intersecting said [01–1] and said [011] orientations, said second direction intersecting said [01–1] and said [011] orientations, and said first and second directions intersecting with respect to each other.

9. The hetero-bipolar transistor according to claim 5, wherein said substrate is made of semi-insulating InP, said collector layer, said base layer, and said emitter contact layer are made of InGaAs, and said emitter layer is made of InP.

10. The hetero-bipolar transistor according to claim 5, wherein said base interconnection is made of titanium, platinum, and gold stacked in this order.

* * * * *